(12) United States Patent
Yedave et al.

(10) Patent No.: US 10,622,192 B2
(45) Date of Patent: Apr. 14, 2020

(54) METHODS AND ASSEMBLIES USING FLUORINE CONTAINING AND INERT GASES FOR PLASMA FLOOD GUN OPERATION

(71) Applicant: ENTEGRIS, INC., Billerica, MA (US)

(72) Inventors: Sharad N. Yedave, Danbury, CT (US); Ying Tang, Brookfield, CT (US); Joseph R. Despres, Middletown, CT (US); Joseph D. Sweeney, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/192,416

(22) Filed: Nov. 15, 2018

(65) Prior Publication Data

US 2019/0189402 A1    Jun. 20, 2019

Related U.S. Application Data

(60) Provisional application No. 62/599,098, filed on Dec. 15, 2017.

(51) Int. Cl.
| | |
|---|---|
| *H01J 37/32* | (2006.01) |
| *H01J 37/317* | (2006.01) |
| *H01J 37/08* | (2006.01) |

(52) U.S. Cl.
CPC ........ *H01J 37/32449* (2013.01); *H01J 37/08* (2013.01); *H01J 37/3171* (2013.01); *H01J 2237/004* (2013.01); *H01J 2237/31701* (2013.01)

(58) Field of Classification Search
CPC .. H01J 37/32449; H01J 37/08; H01J 37/3171; H01J 2237/004; H01J 2237/31701
USPC ............ 250/423 R, 424, 492.1, 492.2, 492.3
See application file for complete search history.

(56) References Cited

U.S. PATENT DOCUMENTS

| | | | | |
|---|---|---|---|---|
| 5,198,718 A | * | 3/1993 | Davis ...................... | H01J 27/16 250/423 R |
| 5,314,540 A | * | 5/1994 | Nakamura ............ | C23C 16/276 118/723 DC |
| 7,411,353 B1 | * | 8/2008 | Rutberg ................... | H05H 1/44 315/111.21 |

(Continued)

FOREIGN PATENT DOCUMENTS

| | | |
|---|---|---|
| WO | 2012024310 W | 5/2012 |
| WO | 2013122986 A8 | 8/2014 |
| WO | 2017117053 W | 7/2017 |

*Primary Examiner* — Nicole M Ippolito
(74) *Attorney, Agent, or Firm* — Entegris, Inc.

(57) ABSTRACT

A gas supply assembly is described for delivery of gas to a plasma flood gun which includes an inert gas and a fluorine-containing gas, wherein the assembly is configured to deliver a volume of the fluorine-containing gas to the flood gun that is not greater than 10% of a total volume of the fluorine-containing and inert gasses. The fluorine-containing gas can generate volatile reaction product gases from material deposits in the plasma flood gun, and to effect re-metallization of a plasma generation filament in the plasma flood gun. In combination with the gas amounts, the assembly and methods can use gas flow rates to optimize the cleaning effect and reduce filament material loss from the plasma flood gun during use.

18 Claims, 3 Drawing Sheets

(56) References Cited

U.S. PATENT DOCUMENTS

2006/0019477 A1* 1/2006 Hanawa .................. C23C 14/48
                                                              438/514
2011/0079241 A1   4/2011  Sinha
2015/0108894 A1   4/2015  Biloiu
2015/0115796 A1   4/2015  Shajii
2018/0337020 A1  11/2018  Bishop

* cited by examiner

METHODS AND ASSEMBLIES USING FLUORINE CONTAINING AND INERT GASES FOR PLASMA FLOOD GUN OPERATION

CROSS-REFERENCE TO RELATED APPLICATIONS

This application claims the benefit under 35 USC 119 of U.S. Provisional Patent Application No. 62/599,098, filed Dec. 15, 2017, the disclosure of which is hereby incorporated herein by reference in its entirety for all purposes.

FIELD OF THE INVENTION

The present disclosure generally relates to ion implantation equipment and processes, and more specifically relates to apparatus and methods for improving ion implant plasma flood gun performance.

BACKGROUND

In the field of semiconductor manufacturing, ion implantation is a basic unit operation of semiconductor device fabrication. Ion implantation equipment may be of widely varying type, and may include beam ion implant systems, plasma immersion systems, and systems of other varied types.

In the use of beam ion implant systems, positively charged ions impinge on the wafer substrate being implanted, and this impingement may lead to build-up of positive charge on insulated regions of the wafer substrate, producing positive surface potentials. Wafer charging may also result from secondary emission of electrons from the wafer substrate. The wafer substrate surface charges may be sufficiently strong to adversely impact or even permanently damage integrated circuitry features of the wafer such as metal-oxide-semiconductor field-effect transistor (MOSFET) circuits.

Plasma flood gun apparatus can be used to address such surface charge build-up, by generating plasma comprising low-energy electrons, so that the low-energy electrons can be dispersed into the ion beam and transported to the wafer surface to neutralize the charge build-up that would otherwise occur.

Plasma flood gun apparatus may be of varying types, but characteristically comprise an arc chamber arranged with an ionization filament element and coupled to a plasma tube circumscribed by solenoid coils, and communicating with an ion beam chamber. The ionization filament element in the arc chamber is formed of a refractory metal, often tungsten, and the gas used to form the low-energy electron plasma is characteristically an inert gas such as argon, krypton, or xenon, among other possibilities. A Faraday assembly may be included for confinement of the neutralizing electrons to the vicinity of the wafer, to thereby assist in mitigating wafer substrate charging, and typically include electron dose, uniformity, and charge measurement and monitoring components.

Thus, plasma flood gun apparatus address operational issues in beam ion implant systems, functioning to neutralize the beam plasma charge to control particle raisings, and reducing charge-up voltage on wafer substrates to prevent electrostatic destruction of thin film integrated circuitry elements.

During plasma flood gun operation, charge-neutralizing low-energy electrons are introduced into the ion beam and act on a substrate wafer to neutralize positive charges that build up on a wafer. However, during this process, inert gas can incidentally sputter the plasma flood gun filament and slowly cause its deterioration. The sputtered filament material becomes a gaseous material that can become deposited onto insulators and graphite components of the ion implant system as deposited contaminants. More generally, with extended operation, ion beam and condensable gas vapors deposit in, on, and around the plasma flood gun arc chamber, and its components. Such vapors also deposit on the Faraday (dose measurement) assembly to which the plasma flood gun is electrically coupled. Those deposits, regardless of their specific origin, are detrimental to the performance of the plasma flood gun system, and are detrimental to the operating lifetime of the system. In terms of performance, for example, these deposits are prone to result in electrical failure due to electrical shorting. Also relating to performance, sputtered filament material, e.g., tungsten, can make its way as into a wafer substrate being ion implanted, placing the sputtered filament material e.g., tungsten, as a contaminant in the substrate and reducing product yield of an ion implantation system and process.

These deposits can also decrease plasma flood gun emission currents, increase filament leakage currents, and, because the plasma flood gun is part of the dose measuring system, create Faraday leakage currents. All of these effects of deposited contaminants within an arc chamber of a flood gun can have a cumulative effect during operation, in a manner that can require regular maintenance, including cleaning of the deposited contaminants, and that can over time reduce the effective lifetime of a plasma flood gun.

SUMMARY

The present disclosure generally relates to ion implantation equipment and processes, and more specifically relates to apparatus and method for improving ion implant plasma flood gun performance. An aspect of the disclosure provides a gas assembly for delivery of gas to a plasma flood gun. The assembly includes a fluid supply package configured to deliver inert gas to the plasma flood gun, which is used for generating inert gas plasma including electrons for modulating surface charge of a substrate in ion implantation operation. The assembly also includes a fluorine-containing gas in mixture with the inert gas, or in a separate gas supply package configured to deliver the fluorine-containing gas concurrently or sequentially with respect to delivery of inert gas to the plasma flood gun. The assembly is configured to deliver a volume of the fluorine-containing gas that is not greater than 10% of a total volume of the fluorine-containing and inert gasses.

Relatedly, the disclosure also provides a method of improving plasma flood gun performance, wherein the method includes steps of (a) introducing a fluorine-containing gas into a PFG, the PFG comprising a filament, and (b) introducing an inert gas into the PFG. In the method, the fluorine-containing gas introduced is not greater than 10% of a total volume of the fluorine-containing and inert gasses that are introduced.

The fluorine-containing gas, when introduced into the arc chamber of the flood gun during operation in an amount of not greater than 10% of a total volume of the fluorine-containing and inert gasses can produce desired effects within the flood gun arc chamber during operation and in turn, improve plasma flood gun performance and lifetime.

The fluorine-containing (≤10%) and inert gases used in amounts described herein can volatize residues present at surfaces within the arc chamber. Residues that originated from the filament of the plasma flood gun and that become volatized by use of the fluorine-containing gas, may be re-deposited on the filament, effectively re-metallizing the filament in the plasma flood gun. A result can be extended filament life of the plasma flood gun filament relative to a lifetime of a filament that is used in the absence of the fluorine-containing gas.

Alternately or additionally, a cleaning effect can be that the fluorine-containing gas is effective to reduce sputtering of the filament. Sputtered filament material (e.g., tungsten) can become implanted as a contaminant in a substrate that is being ion implanted by a process that involves the plasma flood gun, causing a reduction in yield of the process. A reduction of sputtering of the filament will reduce the potential for substrate contamination by ion implantation of the filament material, thereby increasing yield of an ion implantation method that involves the plasma flood gun operated with fluorine-containing and inert gasses as described.

The beneficial effect of the fluorine-containing gas with regards to the filament may be observed after a period of use of the plasma flood gun. For example, during a period of operating the plasma flood gun a current is run through the filament while introducing the fluorine-containing gas and introducing the inert gas. At the end of the period the filament has a weight loss that is less than weight loss of a filament over the same period and operating conditions, but without introducing the fluorine-containing gas. For example, under ideal conditions the fluorine-containing gas can eliminate any weight loss from the filament, or can significantly reduce any weight loss from the filament. For example, using fluorine-containing gas the reduction in weight loss can be at least 50%, or at least 25% of a filament weight loss over the same period and operating conditions, but without using the fluorine-containing gas.

Other aspects, features, and embodiments of the various novel and inventive subject matters of this disclosure will be more fully apparent from the ensuing description and appended claims.

DETAILED DESCRIPTION

Figure 1:
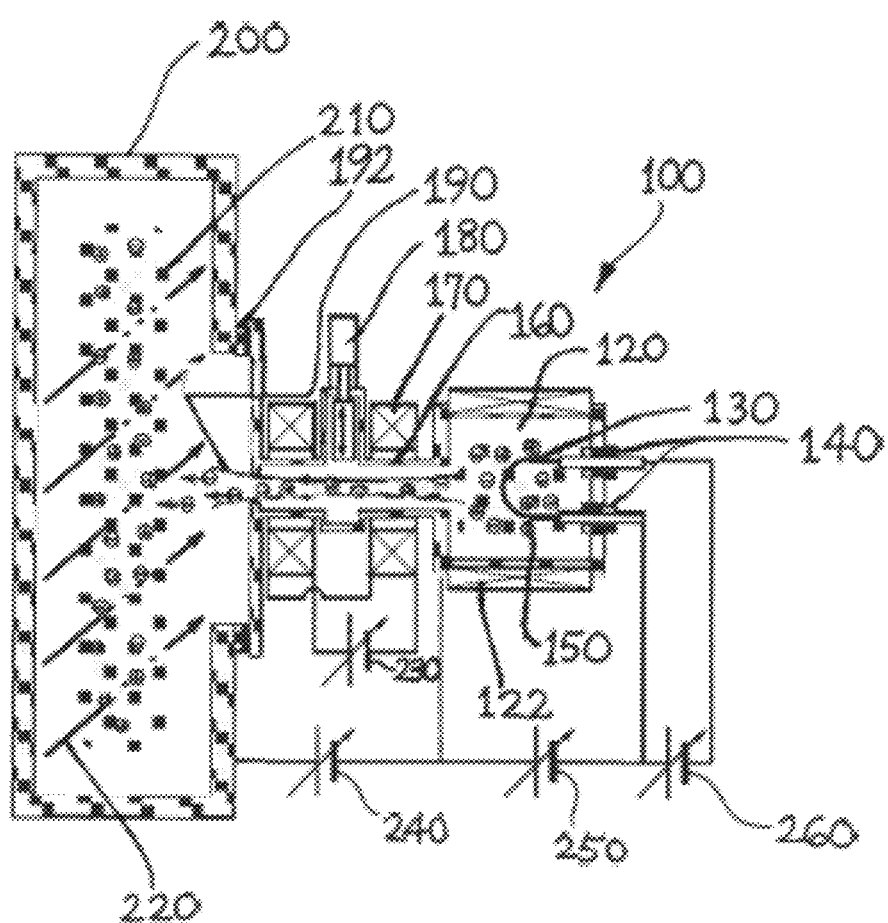
FIG. 1 is a schematic representation of a plasma flood gun apparatus, showing the details of construction thereof

The present disclosure relates generally to ion implantation equipment and processes, and more specifically to apparatus and methods for improving ion implant plasma flood gun performance.

One aspect of the disclosure provides a gas supply assembly for delivery of inert and fluorine-containing gases to a plasma flood gun. The assembly includes a fluid supply package configured to deliver inert gas to the plasma flood gun, which is used for generating inert gas plasma including electrons for modulating surface charge of a substrate in ion implantation operation. The assembly also includes a fluorine-containing gas in mixture with the inert gas, or in a separate gas supply package configured to deliver a fluorine-containing gas concurrently or sequentially with respect to delivery of inert gas to the plasma flood gun. The assembly is configured to deliver a volume of the fluorine-containing gas that is not greater than 10% of a total volume of the fluorine-containing and inert gasses.

As used herein, "a fluorine-containing gas" is a compound that, under plasma flood gun operating conditions, is in gaseous form and includes one or more fluorine atoms. In embodiments, exemplary fluorine-containing gasses are selected from the group consisting of $F_2$, HF, $SiF_4$, $GeF_4$, $PF_3$, $PF_5$, $BF_3$, $B_2F_4$, $NF_3$, $N_2F_4$, $N_2F_2$, $SF_6$, $MoF_6$, $WF_6$, $CF_4$; $COF_2$, $C_2F_4H_2$, and $C_xO_zH_yF_w$, wherein w, x, y, and z are each independently of zero or non-zero stoichiometrically appropriate value. In some embodiments, the fluorine-containing gas is a nitrogen- or tungsten-containing gas, such as $NF_3$ or $WF_6$, respectively.

In the gas supply assembly, the fluorine-containing gas can be represented by a single fluorine-containing gas, or a mixture of fluorine gasses.

With regards to the fluorine-containing, a gas supply assembly that consists essentially of a single fluorine-containing gas means that it is predominant fluorine-containing gas in the assembly. That is, aside from the inert gas, in the fluorine containing gas portion of the assembly, there is very little (not more than 2% volume), or no, other gas that is in mixture with the fluorine containing gas. As starting material for the fluorine containing gas portion of the assembly, one can utilize a fluorine-containing gas, such as hydrogen fluoride, with high purity (e.g., at least 98%, at least 99%) very high purity (e.g., at least 99.9%), or ultra purity (at least 99.99%).

Likewise, in some embodiments, if the fluorine-containing gas is represented by a mixture of consisting essentially of fluorine gasses, such as two or more of $F_2$, HF, $SiF_4$, $GeF_4$, $PF_3$, $PF_5$, $BF_3$, $B2F_4$, $NF_3$, $N_2F_4$, $N_2F_2$, $SF_6$, $MoF_6$, $WF_6$, $CF_4$; $COF_2$, $C_2F_4H_2$, and $C_xO_zH_yF_w$, wherein w, x, y, and z are each independently of zero or non-zero stoichiometrically appropriate value, in said mixture there is very little (not more than 1% volume), or no, other gasses other than the mixture of fluorine containing gasses. An exemplary mixture can be a mixture of a nitrogen- and fluorine-containing gas and tungsten- fluorine-containing gas, such as a mixture of $NF_3$ or $WF_6$, respectively. Likewise, as starting material for a mixture of these gasses, for example, fluorine-containing gasses with high purity, very high purity, or ultra purity can be used.

The inert gas may be of any suitable type that is usefully employed in the plasma flood gun assembly to generate low-energy electrons for charge neutralization at the wafer surface in the ion implantation system. In specific embodiments, the inert gas may for example comprise, consist of, or consist essentially of argon, helium, neon, nitrogen, xenon, krypton, or the like, or a mixture of two or more of these inert gasses.

In such gas supply assembly, the fluorine-containing gas may be in the inert gas fluid supply package in mixture with the inert gas, in various embodiments. Such a supply package can be referred to as an inert and fluorine-containing gas package. In such a package with the mixture of gasses, the fluorine-containing gas is in an amount that is not greater than 10% of a total volume of the fluorine-containing and inert gasses. Accordingly, in the package the amount of inert gas is 90% or greater of a total volume of the fluorine-containing and inert gasses.

Alternatively, the amounts of fluorine-containing gas and inert gas may be described with regards to a molar ratio (a:b) of (a) fluorine of the fluorine gas to (b) inert gas. In some embodiments, the molar ratio (a:b) of (a) fluorine of the fluorine gas to (b) inert gas in the range of 1:9 to 1:999.

In aspects of the disclosure, gas supply assembly is configured to deliver a volume of the fluorine-containing gas in the range of about 0.1 to 10%, about 0.5 to about 5%, or about 1 to about 3% of the total volume of the fluorine-containing and inert gasses. Exemplary gases include nitrogen- and fluorine-containing gases such as $NF_3$ and or tungsten- and fluorine-containing gases such as $WF_6$.

In embodiments, the package includes one or more inert gas(es), such as xenon, in an amount in the range of 90%-99.9% of a total volume, and one or more fluorine-containing gas(es), such as $NF_3$ or $WF_6$, in an amount in the range of 0.1%-10% of a total volume. More specifically, the package can includes one or more inert gas(es), in an amount in the range of 95%-99.5%, and one or more fluorine-containing gas(es) in an amount in the range of 0.5%-5% of a total volume. More specifically, the package can includes one or more inert gas(es), in an amount in the range of 96%-99.25%, and one or more fluorine-containing gas(es) in an amount in the range of 0.75%-4% of a total volume. More specifically, the package can includes one or more inert gas(es), in an amount in the range of 97%-99%, and one or more fluorine-containing gas(es) in an amount in the range of 1%-3% of a total volume. More specifically, the package can includes one or more inert gas(es), in an amount in the range of 97.5%-98.5%, and one or more fluorine-containing gas(es) in an amount in the range of 1.5%-2.5% of a total volume. The gas mixture from the inert and fluorine-containing gas package can be delivered directly to the plasma flood gun to provide the inert and fluorine-containing gasses in desired amounts within any of the described ranges.

In various embodiments, the fluorine-containing gas may be in a separate fluorine-containing gas supply package, and the assembly further includes flow circuitry configured to receive fluorine-containing gas from the fluorine-containing gas supply package and inert gas from the inert gas fluid supply package, for mixing thereof to form a mixture of fluorine-containing gas and inert gas for dispensing to the plasma flood gun. The flow circuitry can be configured to dispense the inert and fluorine-containing gases so that when they are present in the plasma flood gun they are in amounts in the ranges of 90%-99.9% and 0.1%-10%, respectively, of a total volume. The flow circuitry can optionally be configured to dispense the inert and fluorine-containing gases so that when they are present in the plasma flood gun they are in amounts in the ranges of 95%-99.5% and 0.5%-5%, 96%-99.25% and 0.75%-4%, 97%-99% and 1%-3%, 97.5%-98.5% and 1.5%-2.5%, respectively, of a total volume.

In various embodiments, the flow circuitry may include a mixing chamber arranged to receive the fluorine-containing gas and the inert gas from their respective fluid supply packages, for mixing thereof to form the mixture of fluorine-containing gas and inert gas for dispensing to the plasma flood gun.

In various embodiments, the flow circuitry may include valving configured to selectively enable mixing of the fluorine-containing gas and the inert gas in the mixing chamber, and alternatively to selectively enable the fluorine-containing gas and the inert gas to be flowed separately to the plasma flood gun. The valving can be configured to regulate the flow of the gasses so the amount of inert and fluorine-containing gases are in the ranges of 90%-99.9% and 0.1%-10%, respectively, of a total volume, or within any of the more specific ranges as described herein.

In various embodiments, the flow circuitry may include a gas flow conduits such as tubing, wherein the conduit for the inert gas is larger than the conduit for the fluorine-containing gas, wherein the larger sizing of the tubing permits a flow providing a greater volume of inert gas relative to the fluorine-containing gas. As such, the sizing of the conduits can provide a flow of the gasses so the amount of inert and fluorine-containing gases are in the ranges of 90%-99.9% and 0.1%-10%, respectively, of a total volume, or within any of the more specific ranges as described herein.

In various embodiments, the gas supply assembly may comprise a processor configured to control dispensing of fluorine-containing gas from the fluorine-containing gas supply package and separate dispensing of inert gas from the inert gas supply package. In such assembly, the processor may be configured to control dispensing of inert gas so that inert gas is dispensed continuously during ion implantation, and the processor is configured to control dispensing of fluorine-containing gas so that fluorine-containing gas is dispensed intermittently during a dispensing of inert gas, or so that fluorine-containing gas is dispensed sequentially after dispensing of inert gas. Using either continuous or intermittent dispensing, the processor can be configured to dispense the gasses so the amount of inert and fluorine-containing gases are in the ranges of 90%-99.9% and 0.1%-10%, respectively, of a total volume, or within any of the more specific ranges as described herein.

The fluorine-containing gas, when introduced into the arc chamber of the flood gun during operation in an amount of not greater than 10% of a total volume of the fluorine-containing and inert gasses can produce desired effects within the flood gun arc chamber during operation and in turn, improve plasma flood gun performance and lifetime. The fluorine-containing gas or a chemical component derived therefrom may interact with one or more portions of the plasma flood gun, or with residue deposited at the interior of the arc chamber, in a manner that improves one or more of a short-term performance characteristic, a longer term performance characteristic, or a lifespan of the plasma flow gun or an appurtenant ion implantation system.

In the gas supply assembly variously described above, in various method embodiments, fluorine-containing gas, when present in the plasma flood gun, is effective to generate volatile reaction product gases from material deposits in the plasma flood gun. The result can be a "cleaning effect" by which the material deposits can be volatilized and removed from surfaces of the arc chamber, and optionally also be carried out of (e.g., pumped out of) the arc chamber. The fluorine-containing gas can be effective to remove deposits that are present at a wall surface of the arc chamber, at an insulator, or at other surfaces. By this cleaning effect, the amount of residues that are present and that build up on surfaces within the arc chamber during use are reduced when compared to amounts of the same residues that would be present on the surfaces, by operation of the plasma flood gun in an identical manner other than in the absence of the fluorine-containing gas. A reduced presence of residue in the arc chamber can affect improved performance of the plasma flood gun. As one example, residue present at insulators can reduce or prevent the occurrence of electrical failure by shorting that may be directly caused by residue build on the insulators.

Additionally or in the alternate, removing deposits from surfaces of the arc chamber may also improve filament performance or filament lifetime. For example, volatizing residues present at surfaces within an arc chamber, if those residues originated from the filament of the plasma flood gun, may re-enter the arc chamber and become re-deposited on the filament, effectively re-metallizing the filament in the plasma flood gun. A result can be extended filament life of the plasma flood gun filament relative to a filament lifetime of an identical filament of an identical plasma flood gun operation in a manner that is identical except for not having the fluorine-containing gas in the reaction chamber.

For example, during a period of operating the PFG a current is run through the filament while introducing the fluorine-containing gas and introducing the inert gas. If there is any loss of filament material, such as could be determined by comparing the weight of the filament before and after the operating period, the weight loss is less than weight loss of a filament over the same period and operating conditions, but without introducing the fluorine-containing gas. For example, using fluorine-containing gas using weight loss can be less than about 50%, or less than about 25% of a filament weight loss over the same period and operating conditions, but without using the fluorine-containing gas.

Alternately or additionally, a different potential cleaning effect can be that the fluorine-containing gas is effective to reduce sputtering of the filament of the plasma flood gun during operation. Filament material (e.g., tungsten) that becomes sputtered and enters the arc chamber during use can make its way into an implantation beam operated in conjunction with the plasma flood gun. Once in the ion implantation beam, the filament material can become implanted as a contaminant in a substrate that is being ion implanted. The filament material, if present in the substrate, is a contaminant that reduces the yield of the ion implantation process. This cleaning effect of the present disclosure, i.e., reduction of sputtering of the filament material into the arc chamber, will reduce the potential for substrate contamination of an ion implant substrate by the filament material, thereby increasing yield of the ion implantation method that involves the plasma flood gun operated with fluorine-containing gas as described, as compared to an identical method that does not use the fluorine-containing gas in the plasma flood gun.

In embodiments wherein fluorine-containing gas is supplied to a plasma flood gun as a mixture of fluorine-containing gas and inert gas, the mixture may comprise, consist of, or consist essentially of an example fluorine-containing gas as described (a single fluorine-containing gas or a combination of two or more), and inert gas as described. A mixture (e.g., in a package, or otherwise used in a system or method as described) that consists essentially of fluorine-containing gas and inert gas is a mixture that does not contain more than an insubstantial amount of any ingredient other than fluorine-containing gas and inert gas as described.

A plasma flood gun apparatus may be variously constituted within the broad practice of the present disclosure as comprising a gas supply assembly as variously described herein. Similarly, the disclosure contemplates an ion implantation system that includes a plasma flood gun apparatus, as variously constituted.

The disclosure in a further aspect contemplates a method of operating a plasma flood gun configured to receive inert gas flowed to the plasma flood gun from an inert gas source, and to generate inert gas plasma therefrom including electrons energetically adapted to neutralize surface charge of a substrate being ion implanted, said method comprising introducing to the plasma flood gun, intermittently, continuously, or sequentially in relation to flow of fluorine-containing gas to the plasma flood gun.

In the operation of plasma flood gun systems to generate charge-neutralizing low-energy electrons, inert gas sputters the plasma flood gun filament. The sputtered material becomes a gaseous filament material that can form deposits on insulators and graphite components of the ion implant system. With continued operation, ion beam and condensable gas vapors deposit in, on, and around the plasma flood gun arc chamber and its components. Such vapors also deposit on the Faraday (dose measurement) assembly to which the plasma flood gun is electrically coupled. The methods and fluorine-containing gases described herein are effective to reduce, eliminate, or ameliorate these effects by producing a cleaning effect as described herein. One type of cleaning effect is that when used in a method as described, a fluorine-containing gas can be effective to generate volatile reaction product gases from material deposits in the plasma flood gun. This can result in a reduced presence of such material deposits in the arc chamber, i.e., an arc chamber that is cleaner relative to an identical arc chamber operated identically except without the use of the fluorine-containing gas. The reduction in material deposits can in turn improve short term performance of the plasma flood gun and can extend the product life of the plasma flood gun. Additionally or alternately, a cleaning effect of the fluorine-containing gas can be to effect re-metallization of a plasma generation filament in the plasma flood gun.

In methods of the disclosure, the inert gas, alone, or mixed with the fluorine containing gas, can be flowed into the plasma flood gun at one or more desired flow rates. The flow rate of a gas, or gas mixture, can be measured in flow units of standard cubic centimeters per minute (SSCM). In method embodiments of the disclosure, the flow of inert gas introduced into the PFG is at a flow rate of 3 SSCM or less. In more specific embodiments, inert gas is introduced into the PFG at a flow rate in the range of 0.1 to 3 SSCM, at a flow rate in the range of 0.5 to 2 SSCM, or at a flow rate in the range of 0.75 to 1.75 SSCM.

In various embodiments of such methodology, the fluorine-containing gas can be introduced to the plasma flood gun intermittently in relation to flow of inert gas to the plasma flood gun. In such embodiments, fluorine-containing gas can be introduced to the plasma flood gun intermittently in relation to flow of inert gas to the plasma flood gun, wherein the inert gas introduced into the PFG is at a flow rate of 3 SSCM or less, in the range of 0.1 to 3 SSCM, 0.5 to 2 SSCM, or 0.75 to 1.75 SSCM, and wherein the amount of inert and fluorine-containing gases introduced are in the ranges of 90%-99.9% and 0.1%-10%, respectively, of a total volume, or within any of the more specific ranges as described herein.

In various embodiments of the methodology, the fluorine-containing gas may be introduced to the plasma flood gun continuously in relation to flow of inert gas to the plasma flood gun. In such embodiments, fluorine-containing gas can be introduced to the plasma flood gun continuously (e.g., simultaneously, from different flow streams) in relation to flow of inert gas to the plasma flood gun, wherein the inert gas introduced into the PFG is at a flow rate of 3 SSCM or less, in the range of 0.1 to 3 SSCM, 0.5 to 2 SSCM, or 0.75 to 1.75 SSCM, and wherein the amount of inert and fluorine-containing gases introduced are in the ranges of 90%-99.9% and 0.1%-10%, respectively, of a total volume, or within any of the more specific ranges as described herein.

When the in situ fluorine-containing gas and the inert gas are supplied in (at least initially) separate streams, the flow rates of the respective separate streams may be correspondingly varied and determined to achieve relative concentrations of gases deriving from such streams that are sufficient to produce a cleaning effect as described herein, such as to effect removal of deposits in the plasma flood gun assembly, to re-metallize (e.g., re-tungstenize) a filament therein, while also effecting charge neutralization generation of low-energy electrons from the inert gas.

In various embodiments of the methodology, the fluorine-containing gas may be introduced to the plasma flood gun sequentially in relation to flow of inert gas to the plasma flood gun. In such embodiments, fluorine-containing gas can be introduced to the plasma flood gun sequentially in relation to flow of inert gas to the plasma flood gun, wherein the inert gas introduced into the PFG is at a flow rate of 3 SSCM or less, in the range of 0.1 to 3 SSCM, 0.5 to 2 SSCM, or 0.75 to 1.75 SSCM, and wherein the amount of inert and fluorine-containing gases introduced are in the ranges of 90%-99.9% and 0.1%-10%, respectively, of a total volume, or within any of the more specific ranges as described herein.

In various embodiments of the methodology, the fluorine-containing gas maybe flowed to the plasma flood gun in mixture with the inert gas. In such embodiments, a mixture of fluorine-containing and inert gases are introduced into the PFG at a flow rate of 3 SSCM or less, in the range of 0.1 to 3 SSCM, 0.5 to 2 SSCM, or 0.75 to 1.75 SSCM, and wherein the amount of inert and fluorine-containing gases introduced are in the ranges of 90%-99.9% and 0.1%-10%, respectively, of a total volume, or within any of the more specific ranges as described herein.

The above-discussed method may be carried out with the fluorine-containing gas and the inert gas provided to the plasma flood gun from separate gas supply packages. For example, the fluorine-containing gas and inert gas may be mixed with one another exteriorly of the plasma flood gun. By example methods, the admixture may not contain any gas other than fluorine-containing gas and inert gas in significant quantities, and no other gas is supplied to the plasma flood gun other than the fluorine-containing gas and the inert gas, i.e., the gases supplied to the plasma flood gun, e.g., separately or in admixture, consist of or consist essentially of the fluorine-containing gas and the inert gas.

The disclosure contemplates a method of operating an ion implantation system to increase operating life between maintenance events, wherein the ion implantation system comprises a plasma flood gun, and the method includes operating the plasma flood gun according to any mode variously described herein, including the use of a fluorine-containing gas.

As discussed in the Background section hereof, operational issues have characterized the use of plasma flood gun apparatus in beam ion implant systems, including filament-derived tungsten or other refractory metal deposition on insulators and graphite components of the ion implant system, and deposition of other unwanted materials at the arc chamber and Faraday assembly regions of the plasma flood gun in such ion implant system.

As a general operational protocol, plasma flood guns are designed to be periodically maintained, e.g., on a quarterly calendar year basis, but very frequently they require early replacement after only a short period of operation, which may be on the order of only a few weeks. This is disadvantageous, because the plasma flood gun is part of the Faraday, dose, uniformity and charge monitor components of the ion implant system, and wafer requalification is required with each plasma flood gun vacuum break.

The present disclosure provides various solutions to such operational issues. In various embodiments, an in situ fluorine-containing gas is admixed with inert gas that is flowed to the arc chamber of the plasma flood gun. Such admixture may involve provision of a corresponding mixture in a single gas supply vessel used to provide inert source gas (inert gas) to the plasma flood gun arc chamber, so that the mixture is dispensed from such single gas supply vessel to the plasma flood gun. In other embodiments, separate gas supply vessels of inert source gas and in situ fluorine-containing gas may be used, in which the fluorine-containing gas and inert source gas are co-flowed in separate lines to the arc chamber for mixing therein to form the admixed gas, or in which the respective fluorine-containing gas and inert source gas are flowed to a mixing chamber to form the admixed gas that then is flowed in a feed line to the arc chamber of the plasma flood gun, or in which fluorine-containing gas is flowed from a separate gas supply vessel to a gas feed line transporting the inert gas from a separate gas supply vessel to the arc chamber of the plasma flood gun, so that the fluorine-containing gas mixes with the inert source gas in the feed line and is delivered in the admixed gas to the arc chamber of the plasma flood gun. As a further variation, the fluorine-containing gas may be periodically injected into the plasma flood gun arc chamber or an inert gas feed line to the arc chamber. Results, i..e, cleaning effects, of the methods can be to reduce the continued or ongoing buildup of deposited residues at surfaces or components of the plasma flood gun during operation; to effect (e.g., periodic) re-metallization (e.g., re-tungstenization) of the plasma flood gun arc chamber filament; or to effect periodic removal of unwanted deposits from the plasma flood gun and associated ion implant system structure.

Thus, the disclosure contemplates method embodiments that involve providing continuous flow of fluorine-containing gas to the plasma flood gun arc chamber during concurrent continuous flow of inert source gas to such arc chamber, e.g., as a premixed gas mixture from a source vessel containing same, or in various co-flow arrangements in which separate gas supply vessels of inert gas and fluorine-containing gas supply their respective gases directly to the arc chamber, or to a mixing structure (dedicated mixing chamber or injection of the fluorine-containing gas to the feed line for the inert gas being flowed to the arc chamber of the plasma flood gun) upstream of the arc chamber. The disclosure also contemplates periodic (e.g., cyclic or acyclic) delivery of fluorine-containing gas to the plasma flood gun arc chamber during continuous or intermittent flow of inert source gas to such arc chamber.

Thus, the disclosure contemplates various techniques for admixing of in situ fluorine-containing gas with inert gas to produce a desired cleaning effect, e.g., to transport filament material such as tungsten to the plasma flood gun filament, or to more generally form volatile reaction product gases, e.g., volatile fluorides in the case of fluorine-containing gases, from reaction with deposits, so that the resulting reaction product gases can be readily removed from the ion implant system. By certain embodiments, removal of the volatile reaction product gases from the plasma flood gun arc chamber can be effected in the normal discharge of effluent gases from the ion implant system, with the volatile reaction product gases being entrained in and discharged with other effluent gases from the system. Additionally, or alternatively, pumping operations may be conducted to remove such volatile reaction product gases, such as by pumping gas out of the arc chamber during a step of periodically injecting fluorine-containing gas into the inert gas being flowed to the plasma flood gun arc chamber.

The fluorine-containing gas and inert gas as mentioned may be admixed in a unitary gas supply vessel, or separate vessels for each of the fluorine-containing gas and inert gas may be employed. The gas supply vessels in either case can be of any suitable type, and may for example comprise high-pressure gas cylinders, or internally pressure-regulated gas supply vessels, such as those commercially available from Entegris, Inc. (Billerica, Mass., USA) under the trademark VAC®, or adsorbent-based gas supply vessels, such as those commercially available from Entegris, Inc. (Billerica, Mass., USA) under the trademark SDS®.

Thus, as discussed above, in various embodiments, the inert gas and the in situ fluorine-containing gas may be supplied in the first instance as a gas mixture from a unitary gas supply vessel. In other embodiments, the inert gas and in situ fluorine-containing gas may be provided in separate vessels at the site of the plasma flood gun and ion implant apparatus, with the separate vessels dispensing their respective gases to separate flow lines to the plasma flood gun and ion implanter apparatus, for mixing in the apparatus. Alternatively, the separate dispensing lines may dispense gas to a common feed line upstream of the plasma flood gun and ion implanter apparatus, so that the respective gases are intermixed in their flow through the common feed line. As a still further alternative, the separate vessels may dispense respective gases to a mixing chamber, from which the mixed gas flows through a single feed line to the plasma flood gun and ion implanter apparatus. Accordingly, unitary gas mixture fluid supply is contemplated, as well as co-flow arrangements, it being necessary only that the respective gases are combined at or upstream of the plasma flood gun and ion implanter apparatus to provide an admixed gas for generation of low-energy electrons from the inert gas as well as cleaning of the plasma flood gun, re-metallization of the plasma flood gun filament, or both.

In other instances in which the in situ fluorine-containing gas and the inert gas are supplied from separate sources and mixed at the point of use of the plasma flood gun apparatus, it may be advantageous to provide capability in the gas supply circuitry for flow only of the in situ fluorine-containing gas into the ion implant apparatus, while the inert gas is not flowing, in order to provide a high intensity clean of the plasma flood gun. This could be accommodated by a supply vessel and manifold arrangement configured to enable a purge flow of the in situ fluorine-containing gas into the plasma flood gun apparatus, to sweep other gases from the apparatus and enable the cleaning operation of the plasma flood gun to take place, as an intermittent fluorine-containing operation.

Such intermittent high intensity cleaning may be preferred in various embodiments to increase the operating life of the apparatus, and may be integrated as part of the preventive maintenance for the plasma flood gun ion implant apparatus.

In other modes of operation, instead of conducting a dedicated clean operation with concurrent feeding of the admixed in situ fluorine-containing gas and inert gas, it may be desirable to periodically cycle purge an amount of the in situ fluorine-containing gas into the inert gas being flowed into the plasma flood gun ion implant apparatus for normal plasma generation operation, or to periodically cycle purge an amount of the in situ fluorine-containing gas directly into the arc chamber of the plasma flood gun, so that the in situ cleaning by the in situ fluorine-containing gas is carried out automatically and on a periodic basis. This can be accommodated, for example, by utilizing a cycle timer program and a gas cabinet or valve manifold box (VMB) that is configured to mix the in situ fluorine-containing gas into the inert gas to achieve a predetermined concentration of the fluorine-containing gas in the fluorine-containing gas/inert gas mixture.

The approach of the present disclosure, of using an in situ fluorine-containing gas concurrently, intermittently, or sequentially (alternatingly) with an inert process gas to reactively remove deposited build-up of sputtered filament material such as tungsten, and other deposited residues, to improve plasma flood gun and implanter performance, to remetallize the filament in the plasma flood gun, or both, achieves a substantial advance in the art. Relative to identical operation of an identical plasma flood gun operated without the use of fluorine-containing gas as described herein, advantages of the use of a fluorine-containing gas include improving the operational service life of a plasma flood gun in an ion implanter, reducing maintenance events for such equipment, and reducing the occurrence of deleterious operation of the plasma flood gun that can significantly degrade implanter performance.

Referring now to the drawings, FIG. 1 is a schematic representation of a plasma flood gun apparatus 100, showing the details of construction thereof The plasma flood gun apparatus includes an arc chamber 120 in which is disposed a filament 130 supported by insulators 140 at the wall of the arc chamber, and joined by electrical circuitry to the filament power supply 260. When energized, the filament 130 generates a plasma 150 in the arc chamber 120. The arc chamber is provided with magnets 122 at an exterior surface thereof The arc chamber is electrically coupled with the arc power supply 250, as shown. The arc chamber is coupled with a plasma tube 160 that is circumscribed by solenoid coils 170 that are energized by a solenoid coil power supply 230. The plasma tube 160 is equipped with a maintenance valve 180 for the plasma tube. The plasma tube in turn communicates with the ion beam chamber 200 containing beam plasma 210. The magnetic field 190 emitting from the plasma tube 160 is angularly directed to the direction of the ion beam 220 in the ion beam chamber. The ion beam chamber 200 is coupled with an external power supply 240 as part of the power supply circuitry of the plasma flood gun apparatus. The plasma tube 160 is electrically isolated from the ion beam chamber 200 by the isolator.

In operation, the plasma flood gun apparatus of FIG. 1 operates with the filament energized to form a plasma containing low-energy electrons from inert gas introduced to the arc chamber, with the low-energy electrons being dispersed into the ion beam in the ion beam chamber 200, for charge neutralization at the surface of the wafer substrate (not shown in FIG. 1).

Various plasma flood gun operating conditions can be used in conjunction with the flow of inert and fluorine-containing gases into the plasma flood gun. In methods of operating the plasma flood gun while introducing the inert and fluorine-containing gasses, the arc voltage can be a voltage in the range of 0 to 90 volts, in the range of 30 to 70 volts, or in the range of 40 to 60 volts. In methods of operating the plasma flood gun while introducing the inert and fluorine-containing gasses, the arc current can be a current in the range of 0 to 10 amperes, a current in the range of 0.1 to 5 amperes, or a current in the range of 0.25 to 2.5 amperes. In methods of operating the plasma flood gun while introducing the inert and fluorine-containing gasses, the extraction voltage can be a voltage in the range of 0 to 30 kilovolts, a voltage in the range of 0 to 12 kilovolts, or a voltage in the range of 0 to 8 kilovolts. In methods of operating the plasma flood gun while introducing the inert and fluorine-containing gasses, the suppression voltage can be a voltage in the range of 0 to 5 kilovolts, a voltage in the range of 0 to 4 kilovolts, or a voltage in the range of 1 to 4 kilovolts. Combinations of arc voltage, arc current, extraction voltage, and suppression within any of the ranges as described herein can be used.

Figure 2:
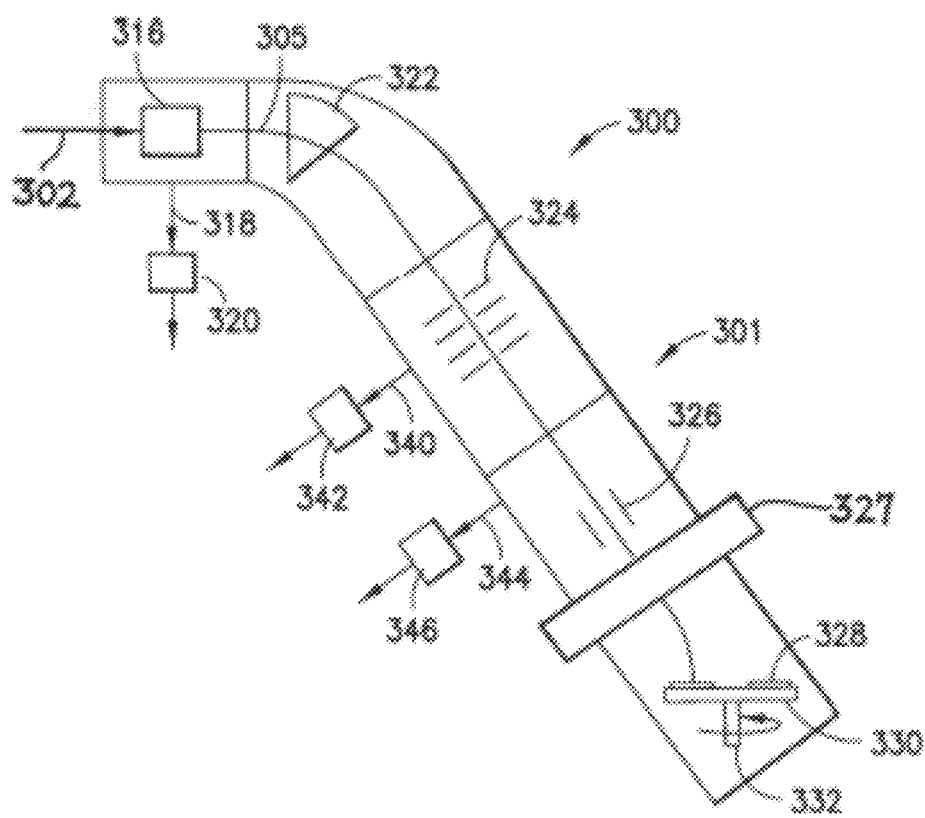
FIG. 2 is a schematic representation of a beam implantation system utilizing a plasma flood gun apparatus in the beamline structure upstream of the wafer substrate being ion implanted.

FIG. 2 is a schematic representation of a beam ion implantation system 300 utilizing a plasma flood gun apparatus in the beamline structure upstream of the wafer substrate being ion implanted.

In the illustrated system 300, the ion implant chamber 301 contains an ion source 316 receiving dopant source gas from line 302 and generates an ion beam 305. The ion beam 305 passes through the mass analyzer unit 322 which selects the ions needed and rejects the non-selected ions.

The selected ions pass through the acceleration electrode array 324 and then the deflection electrodes 326. The resulting focused ion beam then passes through the plasma flood gun 327 which operates to disperse low-energy electrons into the ion beam, and the ion beam augmented with such low-energy electrons then is impinged on the substrate element 328 disposed on the rotatable holder 330 mounted on spindle 332. The ion beam of dopant ions thereby dopes the substrate as desired to form a doped structure, and the low-energy electrons serve to neutralize charge buildup on the surface of the substrate element 328.

The respective sections of the ion implant chamber 301 are exhausted through lines 318, 340 and 344 by means of pumps 320, 342 and 346, respectively.

Figure 3:
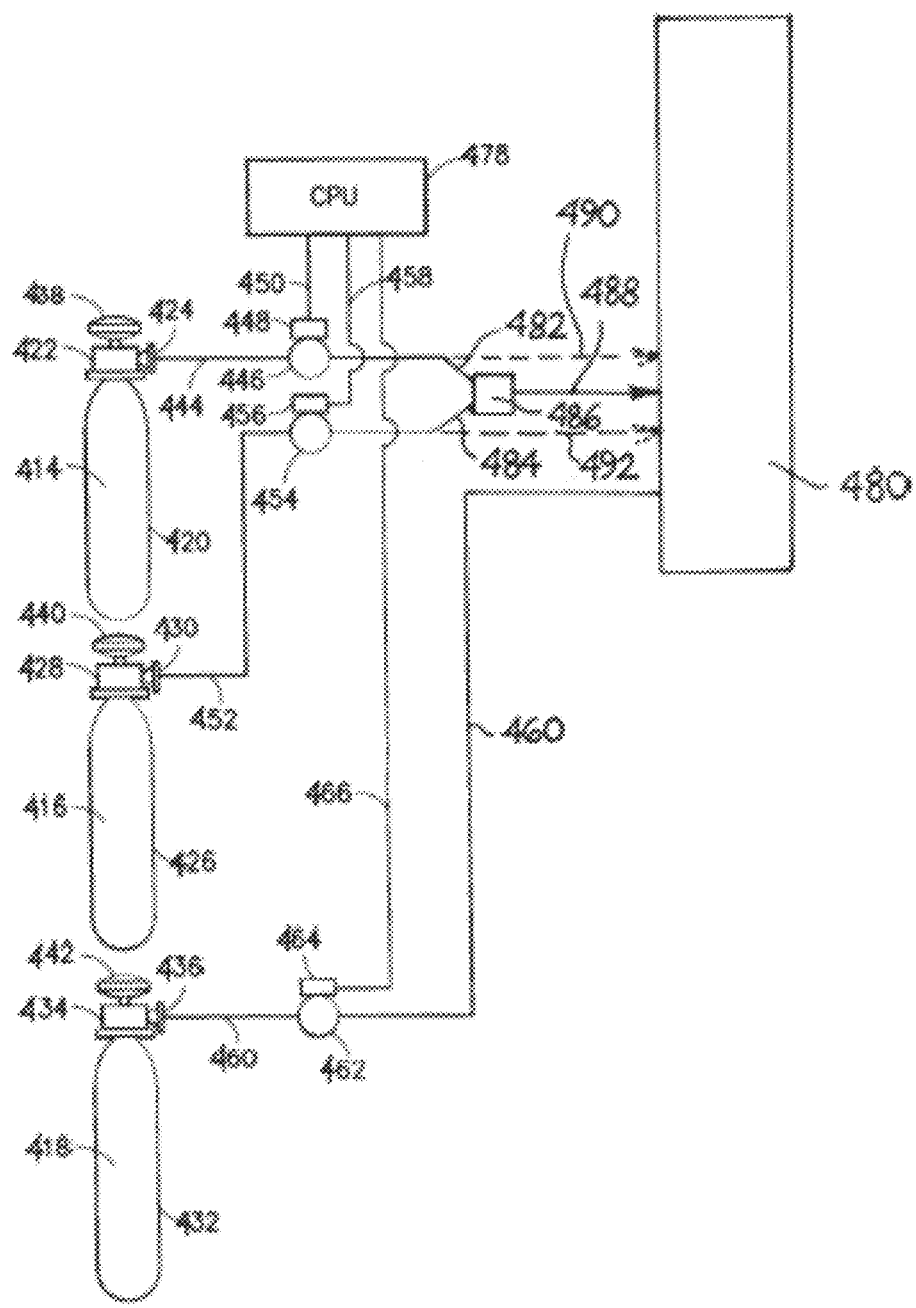
FIG. 3 is a schematic representation of a gas supply assembly configured for delivery of gas to a plasma flood gun, in accordance with an illustrative embodiment of the present disclosure.

FIG. 3 is a schematic representation of a gas supply assembly configured for delivery of gas to a plasma flood gun, in accordance with an illustrative embodiment of the present disclosure.

The plasma flood gun 480 is shown in FIG. 3 as being arranged in fluid receiving relationship to three gas supply packages 414, 416, and 418, for demonstration of various operational modalities of the gas supply assembly. The gas supply package 418 includes a vessel 432 with a valve head assembly 434 with a discharge port 436 joined to gas feed line 460. The valve head assembly 434 is equipped with a hand wheel 442, for manual adjustment of the valve in the valve head assembly, to translate same between fully open and fully closed positions, as desired, to effect dispensing operation, or alternatively, closed storage of the gas mixture in vessel 432. The hand wheel 442 may be substituted by a valve actuator that is automatically controlled to modulate the setting of the valve in the valve head assembly, e.g., a pneumatic valve actuator operably linked to CPU 478.

The vessel 432 contains an in situ fluorine-containing gas/inert gas mixture, which may for example comprise 5% by volume of fluorine gas as the in situ fluorine-containing gas, and 95% by volume of xenon as the inert gas. The gas feed line 460 as shown contains a flow control valve 462 therein. The flow control valve 462 is equipped with an automatic valve actuator 464, having signal transmission line 466 connecting the actuator to CPU 478, whereby CPU 478 can transmit control signals in signal transmission line 466 to the valve actuator to modulate the position of the valve 462, to correspondingly control the flow of the fluorine-containing gas/inert gas mixture from the vessel 432 to the plasma flood gun assembly 480.

As an alternative to the supply of an in situ fluorine-containing gas/inert gas mixture to the plasma flood gun, as existing in premixed form in vessel 432, the gas supply assembly of FIG. 3 includes an alternative arrangement, in which the fluid supply package 414 includes an inert gas in the vessel 420, and in which the fluid supply package 416 includes fluorine-containing gas in vessel 426.

The fluid supply package 414 includes the vessel 420 with a valve head assembly 422 with a discharge port 424 joined to gas feed line 444, for dispensing inert gas from the vessel 420, as previously described. The valve head assembly is equipped with hand wheel 438, which as in the case of fluid supply package 418, may be substituted with an automatic valve actuator operably linked to CPU 478.

In like manner, the fluid supply package 416 includes the vessel 426 with a valve head assembly 428 with a discharge port 430 joined to gas feed line 452, for dispensing fluorine-containing gas from the vessel 426, as previously described. The valve head assembly is equipped with hand wheel 440, which may be substituted with an automatic valve actuator operably linked to CPU 478.

In the FIG. 3 system, the inert gas feed line 444 contains flow control valve 446 equipped with actuator 448 operably linked by signal transmission line 450 to CPU 478. Correspondingly, the fluorine-containing gas feed line 452 contains flow control valve 454 equipped with valve actuator 456 operably linked by signal transmission line 458 to CPU 478. By such arrangement, the CPU 478 may be programmably configured to carry out the dispensing operation of the inert gas from inert gas supply vessel 420 and the dispensing operation of the fluorine-containing gas from fluorine-containing gas supply vessel 426, as desired.

As illustrated in FIG. 3, the inert gas feed line 444 downstream of the flow control valve 446 includes a terminal feed line section 482 joined to the mixing chamber 486. Likewise, the fluorine-containing gas feed line 452 downstream of the flow control valve 454 includes a terminal feed line section 484 joined to the mixing chamber 486. By this arrangement, inert feed gas and fluorine-containing gas can be introduced in the respective terminal feed line sections to the mixing chamber, for mixing thereof and subsequent flow from the mixing chamber 486 in the gas feed line 488 to the plasma flood gun 480. The relative proportions of the respective inert gas and fluorine-containing gas components of the mixture discharged from mixing chamber 486 may be controllably set by appropriate modulation of the flow control valves 446 and 454 in the respective gas feed lines 444 and 452.

As a further alternative in the FIG. 3 system, the inert gas feed line 444 may be connected to the inert gas feed line 490 shown in dashed line representation, for direct introduction of the inert gas to the plasma flood gun apparatus, e.g., directly to the arc chamber of such apparatus. Correspondingly, the fluorine-containing gas feed line 452 may be connected to the fluorine-containing gas feed line 492 shown in dashed line representation, for direct introduction of the fluorine-containing gas to the plasma flood gun apparatus, e.g., directly to the arc chamber of such apparatus. In this manner, the co-flowed inert gas and fluorine-containing gas streams are directly introduced to the plasma flood gun and are admixed with one another in the arc chamber of the apparatus.

The FIG. 3 system can also be operated so that inert gas from vessel 420 is continuously flowed to the plasma flood gun 480 during ion implantation operation of the implanter apparatus in which the plasma flood gun 480 is disposed, while at the same time, the fluorine-containing gas from vessel 426 is introduced to the plasma flood gun only intermittently, e.g., at predetermined cyclic intervals, so that cleaning action and re-metallizing of the filament is effected at such predetermined cyclic intervals, or otherwise in a periodic manner.

As a still further modification of operation in the FIG. 3 system, the fluorine-containing gas, by appropriate valving in the fluorine-containing gas feed lines 452, 492, and/or terminal feed line section 484, may be flowed separately to the plasma flood gun at periodic intervals or otherwise as necessary, during concurrent flow of inert gas to the plasma flood gun, or alternatively after flow of inert gas to the plasma flood gun has been terminated, so that only fluorine-containing gas is flowed to the plasma flood gun apparatus. The valving may accommodate such separate independent operation of fluorine-containing gas flow, without concurrent inert gas flow to the plasma flood gun, and the valving may be modulated, e.g., by appropriate link to the CPU 478, to switch the fluorine-containing gas to the mixing chamber 486 for mixing with inert gas flowed to the mixing chamber, as another mode of operation.

It will therefore be appreciated that the FIG. 3 system may be variously configured to accommodate multiple modes of operation, including flow of premixed inert gas/fluorine-containing gas from a unitary gas supply vessel, co-flow of inert gas and fluorine-containing gas to the plasma flood gun, co-flow of inert gas and fluorine-containing gas to a mixing chamber upstream of the plasma flood gun, periodic introduction of fluorine-containing gas to the plasma flood gun, with or without concurrent inert gas flow to the plasma flood gun (periodic or intervallic cleaning mode), or periodic introduction of fluorine-containing gas to the inert gas stream via the mixing chamber. It will correspondingly be appreciated that the CPU 478 illustratively shown in such system may comprise a processor of any suitable type or types, including a special purpose programmed computer, a programmable logic controller, microprocessor, etc., and that the CPU may be programmable configured to carry out any of the aforementioned modes of operation involving the fluorine-containing gas.

Finally, it will be appreciated that the utilization of fluorine-containing gas in the plasma flood gun operation as herein variously disclosed, achieves a substantial advance in the art, in enabling the operating life of the plasma flood gun to be substantially increased, and the overall efficiency of the ion implantation system to be enhanced.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

EXAMPLE 1

Beam Current Test with Xe Gas

A Bernas ion source with graphite arc chamber was used. The beam conditions were as follows: arc voltage: 50V; arc current: 0.75 A; extraction voltage: 20 kV; suppression voltage: 3 kV. The inert gas used was argon which was flowed into the arc chamber at a rate of either 1 sccm or 1.5 sccm. The fluorine-containing gas was $NF_3$ used at 2% of the gas mixture (Ar+$NF_3$), corresponding to a flow rate of either 0.021 sccm (at 1 sccm Ar flow), or 0.031 sccm (at 1.5 sccm Ar flow). The arc chamber was run for a total of 11 hours under the noted gas flow and the sources were inspected and filament weights measured following the run period, and results are shown in Table 1.

TABLE 1

| Source # | Argon (sccm) | NF3 (%) | Filament Weight Change (g) |
|---|---|---|---|
| 1 | 1 | 0 | −0.037 |
| 2 | 1 | 2% | −0.021 |
| 3 | 1.5 | 0 | −0.030 |
| 4 | 1.5 | 2% | −0.006 |

All filament weight changes were negative correlating with filament weight loss. Filament weight loss was significantly reduced in the presence of the fluorine gas $NF_3$. Further reduction in filament weight loss was observed by increasing the argon flow from 1 sccm to 1.5 sccm, which shifted the weight loss closer to zero.

What is claimed is:

1. A gas supply assembly for delivery of gas to a plasma flood gun (PFG), comprising:
   a fluid supply package configured to deliver inert gas to a PFG for generating inert gas plasma including electrons for modulating surface charge of a substrate in ion implantation operation; and
   a fluorine-containing gas in mixture with the inert gas, or in a separate gas supply package configured to deliver the fluorine-containing gas concurrently or sequentially with respect to delivery of inert gas to the PFG,
   wherein the assembly is configured to deliver a volume of the fluorine-containing gas that is not greater than 10% of a total volume of the fluorine-containing and inert gasses.

2. The gas supply assembly of claim 1 configured to deliver a volume of the fluorine-containing gas in the range of 0.5 to 5% of the total volume of the fluorine-containing and inert gasses.

3. The gas supply assembly of claim 2 configured to deliver a volume of the fluorine-containing gas in the range of 0.75 to 4% of the total volume of the fluorine-containing and inert gasses.

4. The gas supply assembly of claim 3 configured to deliver a volume of the fluorine-containing gas in the range of 1 to 3% of the total volume of the fluorine-containing and inert gasses.

5. The gas supply assembly of claim 4 configured to deliver a volume of the fluorine-containing gas in the range of 1.5 to 2.5% of the total volume of the fluorine-containing and inert gasses.

6. The gas supply assembly of claim 1, wherein the fluorine-containing gas is selected from the group consisting of $F_2$, HF, $SiF_4$, $GeF_4$, $PF_3$, $PF_5$, $BF_3$, $B2F_4$, $NF_3$, $N_2F_4$, $N_2F_2$, $SF_6$, $MoF_6$, $WF_6$, $CF_4$; $COF_2$, $C_2F_4H_2$, and $C_xO_zH_yF_w$, wherein w, x, y, and z are each independently of zero or non-zero stoichiometrically appropriate value.

7. The gas supply assembly of any of the previous claims wherein the fluorine-containing gas is a nitrogen- or tungsten-containing gas.

8. The gas supply assembly of claim 1, wherein the fluorine-containing gas is in a separate fluorine-containing gas supply package, and the assembly further comprises flow circuitry configured to receive fluorine-containing gas from the fluorine-containing gas supply package and inert gas from the inert gas fluid supply package, for mixing thereof to form a mixture of inert gas and fluorine-containing gas for dispensing to the plasma flood gun.

9. The gas supply assembly of claim 8, wherein the flow circuitry comprises (i) a mixing chamber arranged to receive the fluorine-containing gas and the inert gas from their respective fluid supply packages, for mixing thereof to form the mixture of fluorine-containing gas and inert gas for dispensing to the PFG, or (ii) valving configured to selectively enable mixing of the fluorine-containing gas and the inert gas in the mixing chamber, and alternatively to selectively enable the fluorine-containing gas and the inert gas to be flowed separately to the PFG.

10. The gas supply assembly of claim 8, further comprising a processor configured to control dispensing of fluorine-containing gas from the fluorine-containing gas supply package and dispensing of inert gas from the inert gas supply package.

11. The gas supply assembly of claim 1, wherein the fluorine-containing gas is effective to generate volatile reaction product gases from material deposits in the plasma flood gun, to effect re-metallization of a plasma generation filament in the plasma flood gun, or both.

12. A method of improving plasma flood gun (PFG) performance comprising
introducing a fluorine-containing gas into a PFG, the PFG comprising a filament, and
introducing an inert gas into the PFG, wherein
the fluorine-containing gas introduced is not greater than 10% of a total volume of the fluorine-containing and inert gasses that are introduced.

13. The method of claim 12, wherein the inert gas is introduced into the PFG at a flow rate of 3 standard cubic centimeters per minute (SSCM) or less.

14. The method of claim 12, wherein the fluorine-containing and inert gasses are introduced so there is (i) a volume of the fluorine-containing gas in the range of 0.1% to 10% of the total volume of the fluorine-containing and inert gasses; or (ii) a molar ratio (a:b) of (a) fluorine of the fluorine gas to (b) inert gas, in the range of 1:9 to 1:999.

15. The method of claim 12, wherein the PFG is operated under one or more of the following conditions: an arc voltage in the range of 0 to 90volts; an arc current in the range of 0 to 10 amperes, an extraction voltage in the range of 0 to 30 kilovolts, a suppression voltage in the range of 0 to 5 kilovolts.

16. The method of claim 12, wherein during a period of operating the PFG a current is run through the filament while introducing the fluorine-containing gas and introducing the inert gas, and the filament has a weight loss that is less than weight loss of a filament over the same period and operating conditions, but without introducing the fluorine-containing gas.

17. The method of claim 12, wherein any weight loss is reduced by more than 25% compared to weight loss of a filament over the same period and operating conditions.

18. The gas supply assembly of claim 1, wherein the fluid supply package is an internally pressure-regulated gas supply vessel or adsorbent-based gas supply vessel.

* * * * *